United States Patent
Umeda (10) Patent No.: US 11,360,175 B2
(45) Date of Patent: Jun. 14, 2022

(54) MAGNETIC RESONANCE IMAGING APPARATUS

(71) Applicant: CANON MEDICAL SYSTEMS CORPORATION, Otawara (JP)

(72) Inventor: Masaaki Umeda, Tochigi (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 109 days.

(21) Appl. No.: 16/020,006

(22) Filed: Jun. 27, 2018

(65) Prior Publication Data

US 2019/0004136 A1 Jan. 3, 2019

(30) Foreign Application Priority Data

Jun. 28, 2017 (JP) .............................. JP2017-126174
Jun. 26, 2018 (JP) .............................. JP2018-120464

(51) Int. Cl.
| G01R 33/54 | (2006.01) |
| G01R 33/48 | (2006.01) |
| G01R 33/50 | (2006.01) |
| G01R 33/56 | (2006.01) |

(52) U.S. Cl.
CPC ....... *G01R 33/543* (2013.01); *G01R 33/4818* (2013.01); *G01R 33/4824* (2013.01); *G01R 33/4828* (2013.01); *G01R 33/50* (2013.01); *G01R 33/5602* (2013.01); *G01R 33/5607* (2013.01)

(58) Field of Classification Search
None
See application file for complete search history.

(56) References Cited

U.S. PATENT DOCUMENTS

| 2003/0042905 A1* | 3/2003 | Miyazaki ........... G01R 33/5635 324/314 |
| 2007/0007958 A1 | 1/2007 | Foo |
| 2007/0222442 A1* | 9/2007 | Aldefeld .......... G01R 33/56375 324/300 |
| 2008/0161678 A1 | 7/2008 | Miyazaki et al. |
| 2008/0218167 A1* | 9/2008 | Kanda .............. G01R 33/56509 324/309 |
| 2008/0224697 A1* | 9/2008 | Saranathan ........ G01R 33/4818 324/307 |
| 2015/0268319 A1* | 9/2015 | Kirsch ............... G01R 33/4835 324/309 |
| 2015/0276909 A1 | 10/2015 | Kawaji |

FOREIGN PATENT DOCUMENTS

JP 2013027461 A 2/2013

OTHER PUBLICATIONS

Japanese Office Action dated Mar. 8, 2022 for Application No. 2018-120464, 3 pages.

* cited by examiner

*Primary Examiner* — Nasima Monsur
(74) *Attorney, Agent, or Firm* — Nixon & Vanderhye, PC (57) ABSTRACT

According to one embodiment, a magnetic resonance imaging apparatus includes control circuitry that executes a pulse sequence divided into a plurality of first segments, and in which k-space is filled by radial scanning. In the first segment, a plurality of second segments are executed after application of a first preparation pulse. In the second segment, data acquisition along at least one line in k-space is performed after application of a second preparation pulse.

7 Claims, 5 Drawing Sheets

MAGNETIC RESONANCE IMAGING APPARATUS

CROSS-REFERENCE TO RELATED APPLICATIONS

This application is based upon and claims the benefit of priority from the Japanese Patent Application No. 2017-126174, filed Jun. 28, 2017, and the Japanese Patent Application No. 2018-120464, filed Jun. 26, 2018, the entire contents of all of which are incorporated herein by reference.

FIELD

Embodiments described herein relate generally to a magnetic resonance imaging apparatus.

BACKGROUND

Radial scanning is a k-space data filling technique, in which data is radially filled in k-space. In radial scanning, data is acquired along lines crossing the k-space center. Accordingly, fat suppression is difficult to accomplish in the gradient echo using radial scanning. In order to acquire T1-weighted images, an inversion pulse is applied as a preparation pulse prior to data acquisition. In this case, a fat-weighted image is acquired by having a short TE. There is also a technique where a fat suppression pulse is additionally applied as a preparation pulse immediately before data acquisition, in order to acquire fat-suppressed T1-weighted images. However, the fat suppression effect decreases over time.

DETAILED DESCRIPTION

In general, according to one embodiment, a magnetic resonance imaging apparatus includes control circuitry that executes a pulse sequence divided into a plurality of first segments, and in which k-space is filled by radial scanning. In the first segment, a plurality of second segments are executed after application of a first preparation pulse. In the second segment, data acquisition along at least one line in k-space is performed after application of a second preparation pulse.

In the following descriptions, the magnetic resonance imaging apparatus according to the present embodiment will be described with reference to the drawings.

Figure 1:
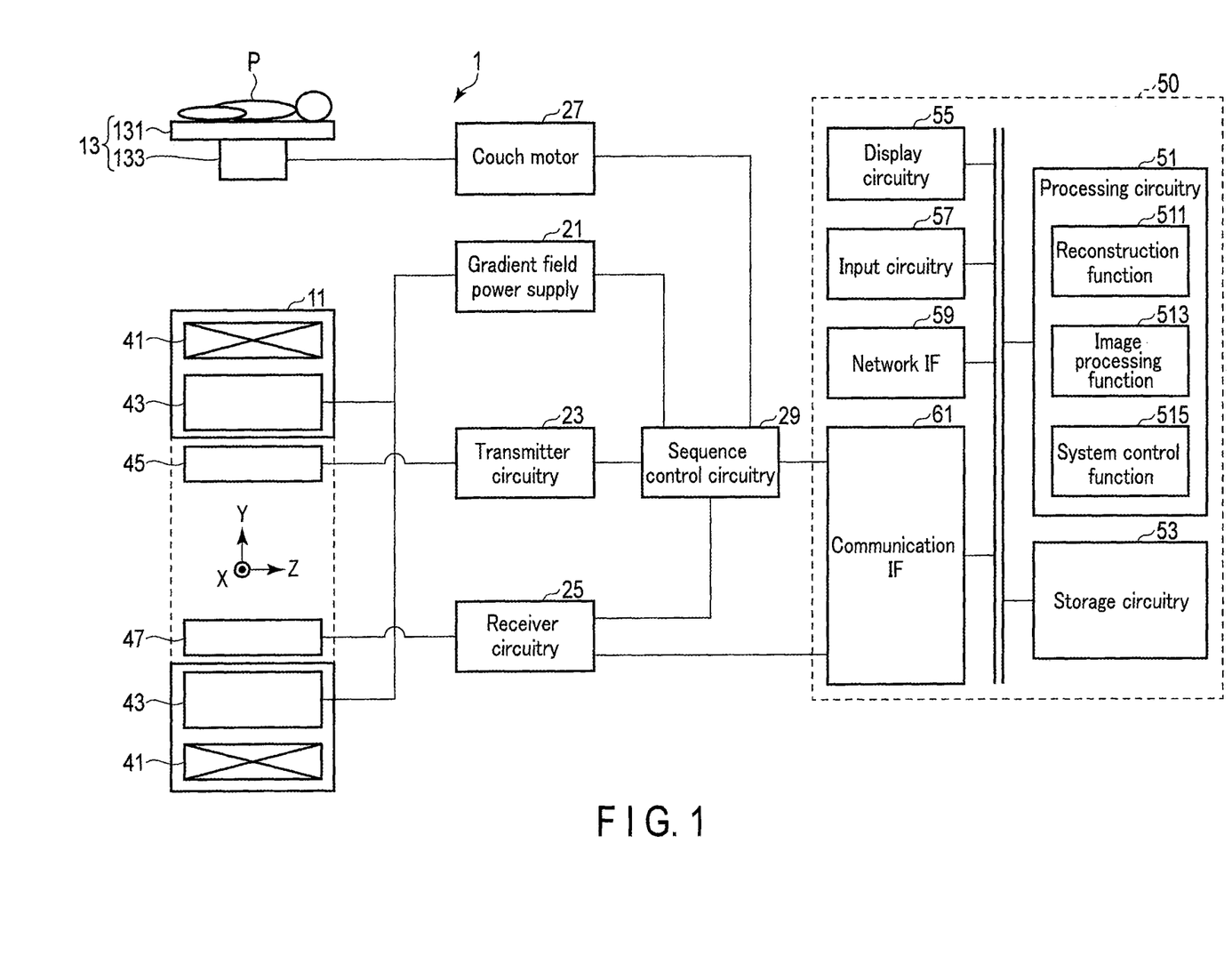
FIG. 1 is a block diagram of the configuration of a magnetic resonance imaging apparatus according to the present embodiment.

FIG. 1 is a block diagram of the configuration of a magnetic resonance imaging apparatus 1 according to the present embodiment. As shown in FIG. 1, the magnetic resonance imaging apparatus 1 includes a gantry 11, a couch 13, a gradient field power supply 21, transmitter circuitry 23, receiver circuitry 25, a couch motor 27, sequence control circuitry 29, and a host PC 50.

The gantry 11 includes a static field magnet 41 and a gradient field coil 43. The static field magnet 41 and the gradient field coil 43 are accommodated in the housing of the gantry 11. A bore with a hollow shape is formed in the housing of the gantry 11. A transmitter coil 45 and a receiver coil 47 are arranged in the bore of the gantry 11.

The static field magnet 41 has a hollow and essentially cylindrical shape, and generates a static magnetic field inside thereof. The static field magnet 41 uses, for example, a permanent magnet, superconducting magnet, normal conducting magnet, etc. The central axis of the static field magnet 41 is defined as a Z axis; an axis vertically perpendicular to the Z axis is referred to as a Y axis; and an axis horizontally perpendicular to the Z axis is referred to as an X axis. The X, Y, and Z axes constitute a three-dimensional orthogonal coordinate system.

The gradient field coil 43 is a coil unit mounted inside the static field magnet 41, and formed in a hollow and essentially cylindrical shape. The gradient field coil 43 generates a gradient field upon receiving a current supplied from the gradient field power supply 21. Specifically, the gradient field coil 43 includes three coils corresponding respectively to the X, Y, and Z axes which are perpendicular to each other. The three coils generate gradient fields in which the magnetic field magnitude changes along the X, Y, and Z axes. The gradient fields along the X, Y, and Z axes are combined to generate a slice selective gradient field Gs, a phase encode gradient field Gp, and a readout gradient field Gr, which are perpendicular to each other, in desired directions. These gradient fields are superimposed on a static magnetic field and applied to a subject P. The slice selective gradient field Gs is used to discretionarily determine an imaging slice.

The phase encode gradient field Gp is used to change the phase of MR signals in accordance with a spatial position. The readout gradient field Gr is used to change the frequency of MR signals in accordance with a spatial position. In the following description, it is assumed that the gradient direction of the slice selective gradient field Gs aligns with the Z axis, the gradient direction of the phase encode gradient field Gp aligns with the Y axis, and the gradient direction of the readout gradient field Gr aligns with the X axis.

The gradient field power supply 21 supplies a current to the gradient field coil 43, in accordance with a sequence control signal from the sequence control circuitry 29. The gradient field power supply 21 supplies a current to the gradient field coil 43 to allow the gradient field coil 43 to generate gradient fields in the X, Y, and Z axis directions. These gradient fields are superimposed on the static magnetic field formed by the static field magnet 41 and applied to the subject P.

The transmitter coil 45 is arranged inside the gradient field coil 43 and generates a high-frequency magnetic field pulse (hereinafter referred to as an RF magnetic field pulse) upon receiving a current supplied from the transmitter circuitry 23.

The transmitter circuitry 23 supplies a current to the transmitter coil 45 to apply an RF magnetic field pulse to the subject P in order to electrically excite target protons in the subject P via the transmitter coil 45. A target proton is typically a proton of a hydrogen atom. The RF magnetic field pulse vibrates at a resonance frequency specific to the target protons, and also electrically excites those target protons. A magnetic resonance signal (hereinafter referred to as an MR signal) is generated from an electrically excited target proton and detected by the receiver coil 47. The transmitter coil 45 may be, for example, a whole body (WB) coil. The WB coil may be used as a transmitter/receiver coil, as described below.

The receiver coil 47 receives MR signals generated from the target protons in the subject P due to the effects of the RF magnetic field pulse. The receiver coil 47 includes a plurality of receiver coil elements which can receive MR signals. The received MR signals are supplied to the receiver circuitry 25 by wiring or wirelessly. Although not shown in FIG. 1, the receiver coil 47 has a plurality of receiver channels arranged in parallel. Each receiver channel includes a receiver coil element which receives MR signals, an amplifier which amplifies the MR signals, etc. MR signals are given off by each receiver channel. The total number of receiver channels may be equal to, more than, or less than the number of receiver coil elements.

The receiver circuitry 25 receives the MR signals generated from electrically excited target protons via the receiver coil 47. The receiver circuitry 25 generates digital MR signals by processing the received MR signals. The digital MR signals are referred to as raw data. The raw data is supplied to the host PC 50 either by wiring or wirelessly.

The aforementioned transmitter coil 45 and receiver coil 47 are merely examples. A transmitter/receiver coil which has a transmit function and a receive function may be used instead of the transmitter coil 45 and the receiver coil 47. Alternatively, the transmitter coil 45, the receiver coil 47, and the transmitter/receiver coil may be combined.

The couch 13 is placed adjacent to the gantry 11. The couch 13 includes a table top 131 and a base 133. The subject P is placed on the table top 131. The base 133 enables the table top 131 to be slid along each of the X, Y, and Z axes. The couch motor 27 is housed in the base 133. The couch motor 27 moves the table top 131 under the control of the sequence control circuitry 29. The couch motor 27 may be any type of motor such as a servo motor or stepping motor.

The sequence control circuitry 29 includes, as hardware resources, a processor such as a Central Processing Unit (CPU) or a Micro Processing Unit (MPU), and a type of memory such as Read Only Memory (ROM) and Random Access Memory (RAM). The sequence control circuitry 29 synchronously controls the gradient field power supply 21, the transmitter circuitry 23, and the receiver circuitry 25, based on pulse sequence information supplied from the host PC 50 via a communication IF 61, and performs data acquisition relative to the subject P with the pulse sequence in accordance with the pulse sequence information.

As shown in FIG. 1, the host PC 50 is a computer unit that includes processing circuitry 51, storage circuitry 53, display circuitry 55, input circuitry 57, a network IF 59, and the communication IF 61.

The processing circuitry 51 includes, as hardware resources, a processor such as a CPU, a GPU (Graphical Processing Unit), an MPU, etc. and a type of memory such as ROM, RAM, etc. The processing circuitry 51 executes various programs to implement a reconstruction function 511, an image processing function 513, and a system control function 515. The processing circuitry 51 may be implemented by an Application Specific Integrated Circuit (ASIC), a Field Programmable Gate Array (FPGA), a Complex Programmable Logic Device (CPLD), or a Simple Programmable Logic Device (SPLD), which implements the reconstruction function 511, the image processing function 513, and the system control function 515. The reconstruction function 511, the image processing function 513, and the system control function 515 may be implemented by either a single board or separate boards.

The processing circuitry 51 which activates the reconstruction function 511 performs reconstruction processing on raw data to reconstruct an image. Specifically, reconstruction processing is performed by FFT (Fast Fourier Transform).

By activating the image processing function 513, the processing circuitry 51 performs various types of image processing upon an image. For example, the processing circuitry 51 executes image processing such as volume rendering, surface rendering, pixel value projection processing, MPR (Multi-Planer Reconstruction), CPR (Curved MPR), etc.

By activating the system control function 515, the processing circuitry 51 controls the entire magnetic resonance imaging apparatus 1 according to the present embodiment.

The storage circuitry 53 is a type of storage such as an HDD (Hard Disk Drive), an SSD (Solid State Drive), or an integrated circuit storage device, etc. which stores various types of information. The storage circuitry 53 may be a drive, etc. which reads and writes various types of information relative to a portable storage medium, such as a CD ROM drive, a DVD drive, or flash memory. For example, the storage circuitry 53 stores raw data acquired by various scans or a program, etc.

The display circuitry 55 displays various information. For example, the display circuitry 55 displays an image generated by the reconstruction function 511, an image processed by the image processing function 513, etc. The display circuitry 55 includes both a display interface and a display. The display interface converts data representing a display target to a video signal. The video signal is supplied to the display.

The display displays the video signal representing the display target. For example, a CRT display, a liquid crystal display, an organic EL display, an LED display, a plasma display, or any other displays known in this technical field can be discretionarily applied as the display in question.

The input circuitry 57 includes an input device and an input interface. The input device receives various instructions from a user. A keyboard, a mouse, various types of switches, a touch screen, a touch pad, etc. can be applied as the relevant input device. The input interface supplies an output signal from the input device to the processing circuitry 51 via a bus. The input circuitry 57 is not limited to circuitry that includes physical operation components such as a mouse, a keyboard, etc. For example, the input circuitry may include electrical signal processing circuitry receiving an electrical signal corresponding to an input operation from an external input device, provided separately from the magnetic resonance imaging apparatus 1, and which outputs the received electrical signal to various circuitry.

The network IF 59 is an interface that connects the magnetic resonance imaging apparatus 1 to a work station, a PACS (Picture Archiving communication System), an HIS (Hospital Information System), an RIS (Radiology Information System), etc. via a LAN (Local Area Network). The network IF performs transmission/reception of various information related to the connected work station, PACS, HIS, and RIS.

The communication IF 61 is an interface that connects the host PC 50 to the sequence control circuitry 29 and the receiver circuitry 25 either via wiring or wirelessly. For example, the communication IF 61 transmits pulse sequence information to the sequence control circuitry 29. The communication IF 61 receives raw data from the receiver circuitry 25.

The configuration described above is only an example, and the present embodiment is not limited thereto. For example, the sequence control circuitry 29 may be installed in the host PC 50. In addition, the sequence control circuitry 29 and the processing circuitry 51 may be implemented on the same board. The sequence control circuitry 29, the gradient field power supply 21, the transmitter circuitry 23, and the receiver circuitry 25 may be implemented on a single control apparatus other than the host PC 50, or may be separately implemented on multiple apparatuses.

A pulse sequence executed by the sequence control circuitry 29 will be described according to the present embodiment. The pulse sequence according to the present embodiment is assumed to be a pulse sequence based on a gradient echo (GRE). The case where fat-suppressed T1-weighted images are acquired is explained as a clinical example.

Figure 5:
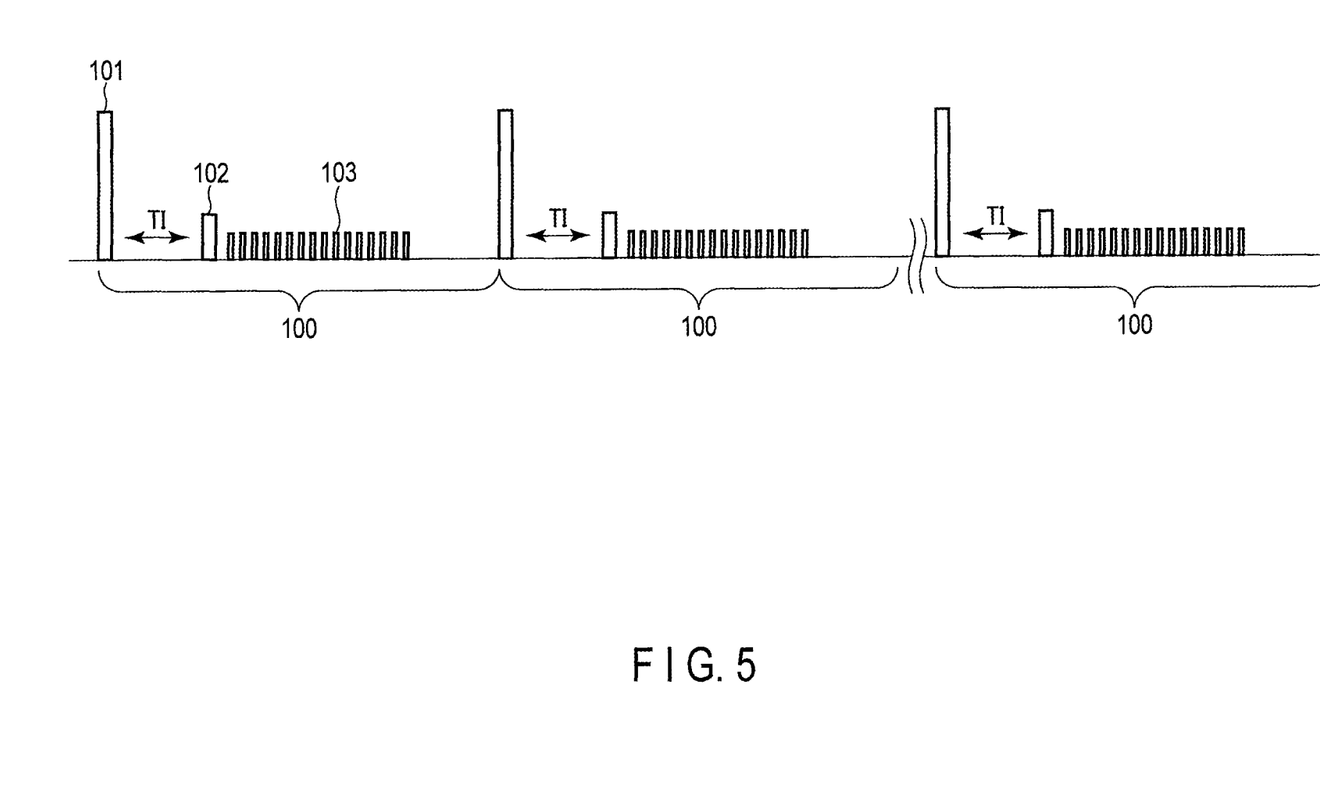
FIG. 5 illustrates an example of a standard pulse sequence based on a gradient echo in order to acquire fat-suppressed T1-weighted images.

FIG. 5 illustrates an example of a standard pulse sequence based on a gradient echo in order to acquire fat-suppressed T1-weighted images. A pulse sequence shown in FIG. 5 is divided into a plurality of segments 100. In each segment 100, an inversion recovery (IR) pulse 101 is first applied. The IR pulse 101 is a 180°-pulse. Application of the IR pulse 101 causes spin inversion in tissues. After the application of the IR pulse 101, recovery of longitudinal magnetization begins. After a predetermined inversion time TI, a fat saturation pulse 102 is applied. The fat saturation pulse 102 is a frequency-selective 90°-pulse tuned to the resonance frequency of fat protons. Application of the fat saturation pulse 102 ensures that magnetization of fat protons is further flipped by 90° from an X-Y plane to a longitudinal magnetization (180°). After the application of the fat saturation pulse 102, multiple numbers of data acquisition segments 103 are executed. A single data acquisition segment 103 corresponds to acquisition of raw data along an acquisition line in k-space. Since the fat saturation pulse 102 is applied prior to the data acquisition segments 103, MR signals from fat are suppressed. However, recovery of the magnetization of fat protons begins immediately after the application of the fat saturation pulse 102. The fat suppression effect is therefore high immediately after the application of the fat saturation pulse 102, but reduces over time.

The data acquisition segments 103 are executed by radial scanning. In the radial scanning, data is acquired along a plurality of acquisition lines (spokes) both crossing the center of k-space and radially extending in k-space. The raw data at the center of k-space represents low frequency components, and contributes greatly to an image. That is to say, for the data acquisition segments 103 executed by radial scanning, raw data at the center of k-space is acquired from every data acquisition segment 103. Accordingly, reduction of fat suppression effect becomes significant as time passes from the application of the fat saturation pulse 102.

Radial scanning techniques include UTE (Ultrashort TE) sequence or zero TE sequence. In some radial scanning, data acquisition is performed along acquisition lines crossing the center of k-space and extending from one end to the opposing end in k-space. UTE sequence or zero TE sequence uses data acquisition that k-space is sampled along acquisition lines extending from the center of k-space to one of the ends.

The sequence control circuitry 29 according to the present embodiment executes a pulse sequence based on a gradient echo that can mitigate reduction of fat suppression effects by fat saturation pulse.

Figure 2:
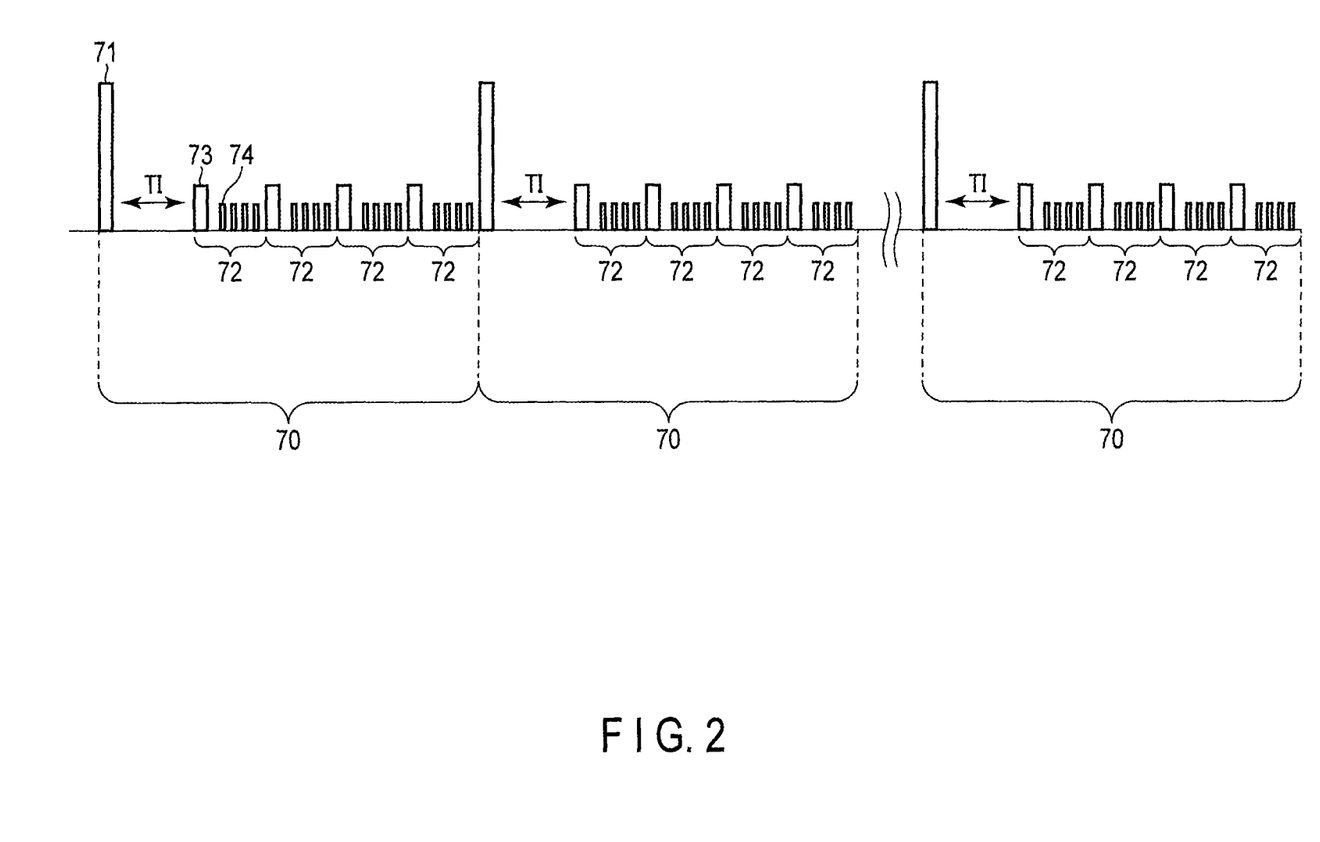
FIG. 2 illustrates an example of a pulse sequence based on a gradient echo to acquire fat-suppressed T1-weighted images, according to the present embodiment.

FIG. 2 provides an illustrated example of a pulse sequence based on a gradient echo to acquire fat-suppressed T1-weighted images, according to the present embodiment. As shown in FIG. 2, the pulse sequence according to the present embodiment is divided into a plurality of first segments 70. The first segments 70 are referred to as outer segments. In each outer segment 70, an inversion pulse 71 is applied as a first preparation pulse. After a predetermined inversion time TI from the application of inversion pulse 71, a plurality of second segments 72 are executed. The second segments 72 are referred to as inner segments. In each inner segment 72, a fat saturation pulse 73 is applied as a second preparation pulse. After the application of the fat saturation pulse 73, multiple numbers of data acquisition segments 74 are executed. A single data acquisition segment 74 corresponds to acquisition of raw data along an acquisition line in k-space. Each data acquisition segment 74 is suitably performed by radial k-space filling, but may also be performed by Cartesian k-space filling. In radial scanning, a single data acquisition segment 74 corresponds to acquisition of raw data along an acquisition line in k-space. In order to weight T1 values between tissues of a subject, a TE is set to a relatively short value.

The pulse sequence according to the present embodiment may be applied to either two-dimensional data acquisition targeting a single two-dimensional slice, or three-dimensional data acquisition targeting a single three-dimensional volume. For two-dimensional data acquisition, data acquisition is performed along hundreds of acquisition lines to fill k-space. For example, if a total of 900 acquisition lines are arranged, the pulse sequence is divided into approximately three outer segments, and each outer segment is divided into approximately 30 inner segments. In this case, a single application of an inversion pulse and approximately 30 inner segments are executed in each outer segment, and a single application of a fat saturation pulse 73 and 10 data acquisition segments are executed in each inner segment. That is to say, according to the pulse sequence of the present embodiment, a fat saturation pulse 73 is applied multiple times during acquisition of raw data for a single slice.

For three-dimensional data acquisition, data acquisition is performed along thousands, and possibly as many as tens of thousands, of acquisition lines to fill k-space. For example, if a total of 30,000 acquisition lines are arranged, the pulse sequence is divided into approximately 100 outer segments, and each outer segment is divided into approximately 30 inner segments. In this case, a single application of an inversion pulse and approximately 30 inner segments are executed in each outer segment, and a single application of the fat saturation pulse 73 and 10 data acquisition segments are sequentially executed in each inner segment. That is to say, according to the pulse sequence of the present embodiment, the fat saturation pulse 73 is applied multiple times during acquisition of raw data for a single volume. The three-dimensional data acquisition according to the present embodiment is not multi-slice data acquisition in which data acquisition is sequentially performed to multiple slices, but volume data acquisition in which data acquisition is performed to a single volume by applying encoding pulses in three axial directions.

Three-dimensional gradient echo approaches, in which applications of IR pulses are combined, include MP-RAGE (Magnetization Prepared Rapid Acquired Gradient Echo) and IR-SPGR (Inversion Recovery Spoiled Gradient Recalled Acquisition In Steady State). MP-RAGE or IR-SPGR may be used for three-dimensional data acquisition according to the present embodiment.

Here, the operation of the sequence control circuitry 29 in MR imaging according to the aforementioned pulse sequence will be described. First, the sequence control circuitry 29 controls the gradient field power supply 21 and the transmitter circuitry 23 to apply a slice selective gradient field and the inversion pulse 71. If the elapsed time from the application of the inversion pulse 71 exceeds the inversion time TI, the sequence control circuitry 29 controls the transmitter circuitry 23 to apply a fat saturation pulse 73, and controls the gradient field power supply 21 to apply a spoiler gradient field pulse. After the application of the fat saturation pulse 73, the sequence control circuitry 29 synchronously controls the gradient field power supply 21, the transmitter circuitry 23, and the receiver circuitry 25, and executes a predetermined number of data acquisition segments 74. The predetermined number of data acquisition segments 74 (hereinafter referred to as the first number of data acquisition segments) is the number of data acquisition segments 74 included in the inner segment 72, and determined in advance. The first number of data acquisition segments is determined to be sufficient to maintain fat suppression effects by application of the fat saturation pulse 73 to a predetermined degree in each inner segment 72. The first number of data acquisition segments is the same in each inner segment.

For the data acquisition segment 74 by radial scanning, the sequence control circuitry 29 synchronously controls the gradient field power supply 21, the transmitter circuitry 23 and the receiver circuitry 25 to acquire raw data along a target acquisition line in each data acquisition segment 74. Specifically, the sequence control circuitry 29 first controls the transmitter circuitry 23 to apply an RF pulse with a predetermined flip angle, and controls the gradient field power supply 21 to apply a slice selective gradient field. Thereafter, the sequence control circuitry 29 controls the gradient field power supply 21 to form a readout gradient field corresponding to the target acquisition line, and simultaneously applies a phase encode gradient field and a frequency encode gradient field, each having a magnetic field intensity corresponding to the target acquisition line. An MR signal is generated within a predetermined time duration including TE after the application of the RF pulse. The sequence control circuitry 29 controls the receiver circuitry 25 to receive an MR signal within the predetermined time duration. The receiver circuitry 25 converts the received MR signal to raw data, and the storage circuitry 53 stores the raw data.

After the first number of data acquisition segments 74 are executed in one of the manners stated above, the sequence control circuitry 29 determines whether or not a predetermined number of inner segments 72 (hereinafter referred to as a second number of inner segments) included in each outer segment 70 have been executed. If it is determined that the second number of inner segments 72 have not been executed, the sequence control circuitry 29 applies the fat saturation pulse 73 again, and executes the first number of data acquisition segments 74.

After the second number of inner segments 72 are executed, the sequence control circuitry 29 determines whether or not a predetermined number of the outer segments 70 included in the pulse sequence (hereinafter referred to as a third number of outer segments) have been executed. If it is determined that the third number of outer segments 70 have not been executed, the sequence control circuitry 29 applies the inversion pulse 71 again, and executes the second number of inner segments 72. After the third number of outer segments 70 are executed, the sequence control circuitry 29 ends MR imaging according to the present embodiment.

As shown in FIG. 2, in the pulse sequence according to the present embodiment, a data acquisition sequence of the outer segment 70 is further divided into a plurality of inner segments 72, and a fat saturation pulse 73 is applied in each inner segment 72. In the pulse sequence according to the present embodiment, in comparison with the pulse sequence shown in FIG. 5, fat saturation pulses 73 are applied several times between the application of inversion pulses 71. Accordingly, even if each data acquisition segment 74 is executed by radial scanning, reduction of the fat suppression effects of the fat saturation pulses 73 is mitigated in each data acquisition segment 74.

After the execution of the pulse sequence ends, the processing circuitry 51 activates the reconstruction function 511. The processing circuitry 51 activates the reconstruction function 511 to reconstruct a T1-weighted image by performing reconstruction processing such as FFT, etc. to raw data acquired by the execution of the pulse sequence. The T1-weighted image is displayed on the display circuitry 55. As stated above, even though the data acquisition segments 74 are executed by radial scanning, since reduction of the fat suppression effects of the fat saturation pulse 73 is mitigated in each data acquisition segment 74, the processing circuitry 51 can reconstruct a T1-weighted image in which fat is favorably suppressed.

The first number of data acquisition segments in the pulse sequence is assumed to be the same in each inner segment. However, the present embodiment is not limited thereto, and the first number may differ between inner segments. For example, if the data acquisition segment 74 is executed by Cartesian scanning, the number of data acquisition segments 74 of an inner segment in which a data acquisition segment 74 for an acquisition line passing the center of k-space is not included may be set greater than the number of data acquisition segments 74 of an inner segment, in which the data acquisition segment 74 for an acquisition line passing the center of k-space is included. For example, for Cartesian scanning that acquires raw data from the center of phase encode in k-space, the number of data acquisition segments in an inner segment may be increased, namely, the number of application of fat saturation pulses 73 may be decreased, as time passes after the fat saturation pulse 73 is applied in the first inner segment.

The aforementioned pulse sequence is assumed to be applied for a frequency selective fat suppression method, such as CHESS (Chemical Shift Selective Excitation), which is a technique to suppress MR signals from fat. That is to say, it is assumed that frequency-selective RF pulses are applied as fat saturation pulses 73 to suppress MR signals from fat. However, the present embodiment is not limited thereto. For example, a pulse sequence assumed for a non-selective fat suppression method such as STIR (Short TI Inversion Recovery), etc. may be used as a technique to suppress MR signals from fat.

In the above descriptions, it is assumed that the inversion pulse for T1-weighting is applied as the first preparation pulse. However, the present embodiment is not limited thereto. For example, a T2 preparation pulse for T2-weighting may be applied as the first preparation pulse.

Figure 3:
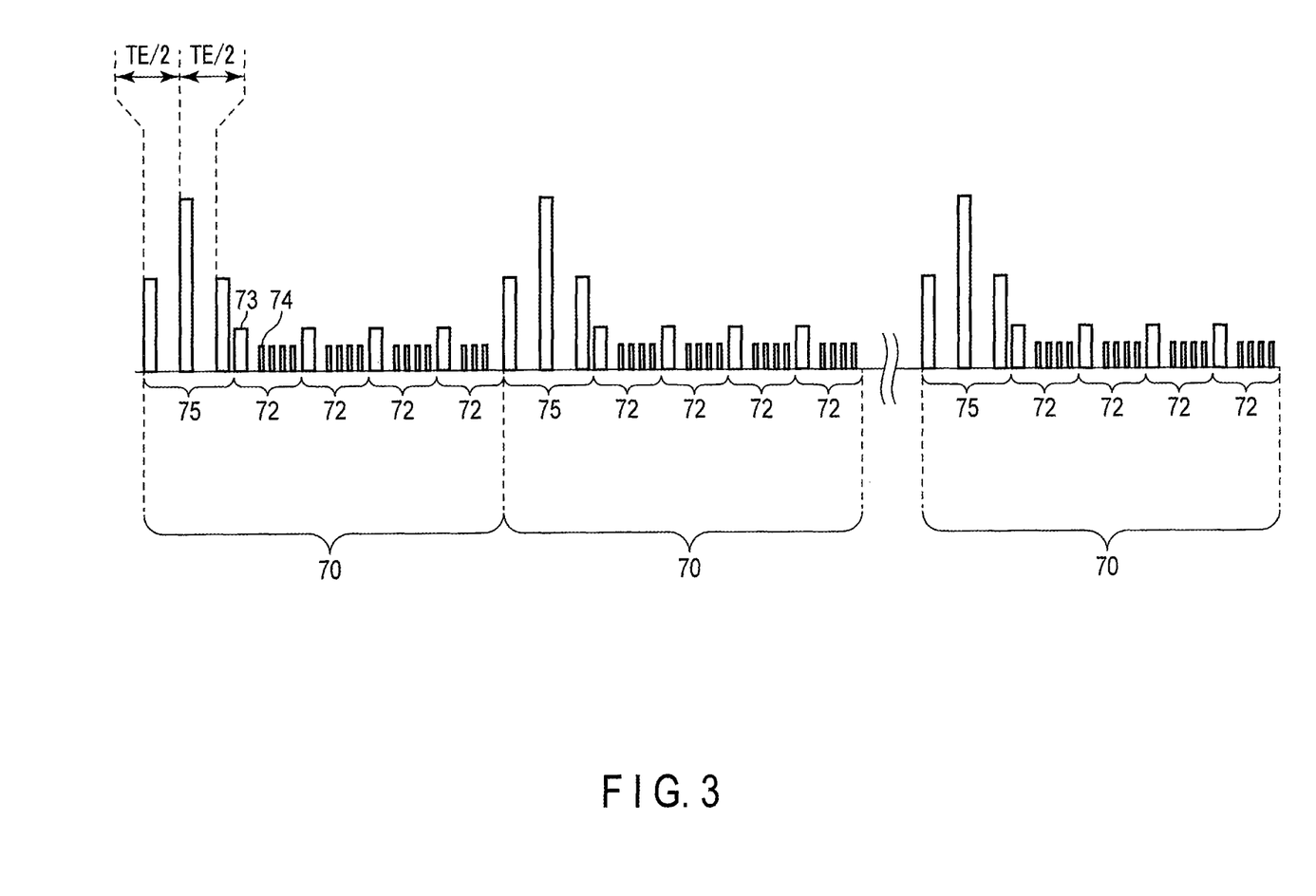
FIG. 3 illustrates an example of a pulse sequence including T2 preparation pulses, according to the present embodiment.

FIG. 3 illustrates an example of a pulse sequence including T2 preparation pulses 75, according to the present embodiment. As shown in FIG. 3, the pulse sequence is divided into the third number of outer segments 70. In each outer segment 70, the T2 preparation pulses 75 are applied first. The T2 preparation pulses 75 are grouped as an RF pulse group to obtain T2 contrast utilizing the difference of T2 values between tissues. The T2 preparation pulse includes, for example, three RF pulses such as 90°-pulse, 180°-pulse, and −90°-pulse. A 180°-pulse is applied after TE/2 of 90°-pulse application, and a −90°-pulse is applied after TE/2 of 180°-pulse application. After the application of T2 preparation pulses 75, the second number of inner segments 72 included in each outer segment 70 are executed. The pulse sequence of the inner segment 72 is the same as that shown in FIG. 2.

Here, the operation of the sequence control circuitry 29 in MR imaging according to the aforementioned pulse sequence will be described. First, the sequence control circuitry 29 controls the transmitter circuitry 23 to apply the T2 preparation pulses 75 including a 90°-pulse, a 180°-pulse, and a −90°-pulse sequentially at an interval of TE/2. Through the application of the T2 preparation pulses 75, longitudinal magnetization of the fat protons with short T2 values becomes lesser than longitudinal magnetization of protons of other tissues having long T2 values. After application of the T2 preparation pulses 75, the sequence control circuitry 29 controls the transmitter circuitry 23 to apply the fat saturation pulse 73, and controls the gradient field power supply 21 to apply a spoiler gradient field pulse. After application of the fat saturation pulse 73, the sequence control circuitry 29 synchronously controls the gradient field power supply 21, the transmitter circuitry 23, and the receiver circuitry 25, and performs the first number of data acquisition segments 74 included in each inner segment. The k-space filling method of the data acquisition segments 74 is typically a radial scanning, but not limited thereto. Cartesian scanning may also be adopted.

After execution of the first number of data acquisition segments 74, the sequence control circuitry 29 determines whether or not the second number of inner segments 72 have been executed. If it is determined that the second number of inner segments 72 have not been executed, the sequence control circuitry 29 applies the fat saturation pulse 73 again, and executes the first number of data acquisition segments 74. After the second number of inner segments 72 are executed, the sequence control circuitry 29 determines whether or not the third number of outer segments 70 have been executed. If it is determined that the third number of outer segments 70 have not been executed, the sequence control circuitry 29 applies the inversion pulse 71 again, and executes the second number of inner segments 72. After the third number of outer segments 70 are executed, the sequence control circuitry 29 ends MR imaging.

Through execution of MR imaging according to the pulse sequence for T2-weighting, as shown in FIG. 3, raw data in which fat is suitably suppressed can be acquired in each data acquisition segment 74. The processing circuitry 51 can reconstruct T2-weighted images in which fat is suitably suppressed by performing reconstruction processing to the acquired raw data.

According to at least one of the aforementioned embodiments, the magnetic resonance imaging apparatus 1 includes the sequence control circuitry 29. The sequence control circuitry 29 executes a pulse sequence which includes a plurality of outer segments based on a gradient echo. The sequence control circuitry 29 applies the first preparation pulse in each outer segment, and thereafter executes a plurality of inner segments. The sequence control circuitry 29 applies the second preparation pulse in each inner segment, and thereafter, executes data acquisition along at least one acquisition line in k-space.

With the aforementioned configuration, the second preparation pulses are applied multiple times between the application of the first preparation pulses. Accordingly, this can mitigate reduction of the effects of the second preparation pulse.

In the above descriptions, it is assumed that the first preparation pulse is applied in the outer segment 70. However, the present embodiment is not limited thereto. For example, a gating signal in gated imaging may be used instead of the first preparation pulse. For example, a cardiac gating signal output from an electrocardiograph upon detection of a predetermined heartbeat phase is used as a gating signal for cardiac gated imaging, and a respiratory gating signal output from a respirometer upon detection of a predetermined respiratory phase is used for respiratory gated imaging. Here, a pulse sequence for gated imaging will be described using cardiac gated imaging as an example.

Figure 4:
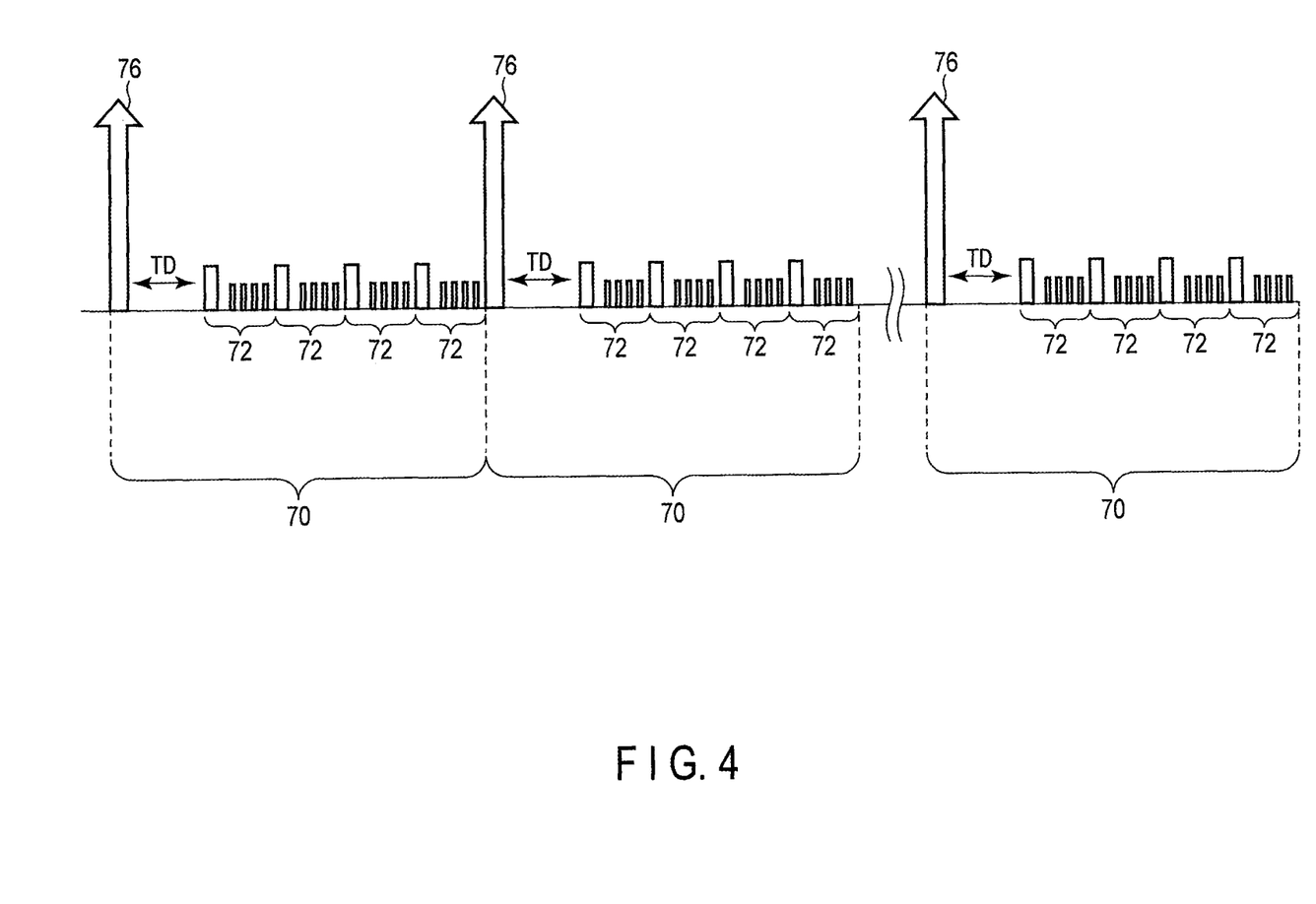
FIG. 4 illustrates an example of a pulse sequence relating to cardiac gated imaging according to the present embodiment.

FIG. 4 illustrates an example of a pulse sequence relating to cardiac gated imaging according to the present embodiment. As shown in FIG. 4, the pulse sequence according to the present embodiment is divided into the third number of outer segments 70. In each outer segment 70, a cardiac gating signal is first input from an electrocardiograph to the sequence control circuitry 29. After a predetermined time delay TD of the cardiac gating signal input, the second number of inner segments included in each outer segment are executed. The pulse sequence of the inner segment is the same as that shown in FIG. 2.

Here, the operation of the sequence control circuitry 29 in cardiac gated imaging according to the aforementioned pulse sequence will be described. First, the sequence control circuitry 29 waits for the input of a cardiac gating signal 76 from the electrocardiograph. If the cardiac gating signal 76 is the input, the sequence control circuitry 29 measures an elapsed time after the input of the cardiac gating signal 76, and waits until the elapsed time exceeds the time delay TD. If the elapsed time exceeds the time delay TD, the sequence control circuitry 29 controls the transmitter circuitry 23 to apply a fat saturation pulse 73, and controls the gradient field power supply 21 to apply a spoiler gradient field pulse. After application of the fat saturation pulse 73, the sequence control circuitry 29 synchronously controls the gradient field power supply 21, the transmitter circuitry 23, and the receiver circuitry 25, and performs the first number of data acquisition segments 74 included in each inner segment. The k-space filling method of the data acquisition segments 74 is typically a radial scanning, but not limited thereto. Cartesian scanning may also be adopted.

After execution of the first number of data acquisition segments 74, the sequence control circuitry 29 determines whether or not the second number of inner segments 72 have been executed. If it is determined that the second number of inner segments 72 have not been executed, the sequence control circuitry 29 applies the fat saturation pulse 73 again, and executes the first number of data acquisition segments 74. After the second number of inner segments 72 are executed, the sequence control circuitry 29 determines whether or not the third number of outer segments 70 have been executed. If it is determined that the third number of outer segments 70 have not been executed, the sequence control circuitry 29 applies the inversion pulse 71 again, and executes the second number of inner segments 72. After the third number of outer segments 70 are executed, the sequence control circuitry 29 ends cardiac gated imaging according to the present embodiment.

Through execution of the cardiac gated imaging according to the pulse sequence as shown in FIG. 4, raw data in which fat is suitably suppressed can be acquired in each data acquisition segment 74. The processing circuitry 51 can reconstruct an image in which fat is suitably suppressed by performing reconstruction processing to the acquired raw data.

According to the aforementioned embodiments, the magnetic resonance imaging apparatus 1 includes the sequence control circuitry 29. The sequence control circuitry 29 executes a pulse sequence which includes a plurality of outer segments based on a gradient echo. The sequence control circuitry 29 executes a plurality of inner segments after the input of a gating signal in each outer segment. The sequence control circuitry 29 applies the second preparation pulse in each inner segment, and thereafter, executes data acquisition along at least one acquisition line in k-space.

With the aforementioned configuration, the second preparation pulses are applied multiple times between the input of gating signals. Accordingly, this can mitigate reduction of the effects of the second preparation pulse.

The sequence control circuitry 29 according to the aforementioned embodiments is assumed to execute the pulse sequence based on a gradient echo. The pulse sequence according to the present embodiment may be applied to a combination of a gradient echo and an EPI (Echo Planar Imaging). In the EPI, a single data acquisition segment 74 includes application of a 90°-pulse, followed by alternative polarity inversion application of gradient field pulses and data acquisition. Either a single shot EPI or a multi-shot EPI may be combined with the gradient echo. In the case where the single shot EPI is used, k-space is filled by a single data acquisition segment 74. That is to say, the data acquisition segment 74 is performed at least once in the inner segment 72. In the case of using the multi-shot EPI, k-space is filled by multiple numbers of data acquisition segments 74. For example, in the case where k-space is filled by four data acquisition segments 74, and a single data acquisition segment 74 is executed in the inner segment 72, the application of the fat saturation pulse 73, followed by the single data acquisition segment 74 is repeated four times to fill k-space.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus comprising control circuitry that executes a pulse sequence for filling k-space by radial scanning, the pulse sequence being divided into a plurality of first segments, wherein:
   the control circuitry executes a plurality of second segments after application of a first preparation pulse in each of the first segments, each of the first segments including the plurality of second segments; and
   the control circuitry executes data acquisition along at least one line in k-space after application of a second preparation pulse to suppress a fat signal in each of the second segments, the at least one line including center of the k-space, a type of the second preparation pulse being different from a type of the first preparation pulse,
   wherein the control circuitry executes the pulse sequence to acquire data required for reconstructing a single two-dimensional slice in two-dimensional data acquisition or for reconstructing a single three-dimensional volume in three-dimensional data acquisition,
   the second preparation pulse is applied to a beginning of each of the second segments, so that the second preparation pulse is applied multiple times per slice or volume, wherein the second preparation pulse is a fat saturation pulse, and
   the three-dimensional data acquisition is not multi-slice data acquisition in which data acquisition is sequentially performed to multiple slices, but volume data acquisition in which data acquisition is performed to a single volume by applying encoding pulses in three axial directions.

2. The magnetic resonance imaging apparatus according to claim 1, wherein the control circuitry applies an inversion pulse as the first preparation pulse.

3. The magnetic resonance imaging apparatus according to claim 1, wherein the control circuitry executes the pulse sequence in which T1 values or T2 values between tissues of a subject are weighted.

4. The magnetic resonance imaging apparatus according to claim 1, further comprising processing circuitry that reconstructs a T1-weighted image or a T2-weighted image based on data acquired by executing the pulse sequence.

5. A magnetic resonance imaging apparatus comprising control circuitry that executes a pulse sequence for filling k-space by radial scanning, the pulse sequence being divided into a plurality of first segments, wherein:
   the control circuitry executes a plurality of second segments after a gating signal in each of the first segments, each of the first segments including the plurality of second segments, the gating signal being outputted from an electrocardiograph or a respirometer; and
   the control circuitry executes data acquisition along at least one line in k-space after application of a preparation pulse in each of the second segments, the preparation pulse being different from the gating signal,
   wherein the control circuitry executes the pulse sequence to acquire data required for reconstructing a single two-dimensional slice in two-dimensional data acquisition or for reconstructing a single three-dimensional volume in three-dimensional data acquisition,
   the preparation pulse is applied to a beginning of each of the second segments, so that the preparation pulse is applied multiple times per slice or volume, wherein the preparation pulse is a fat saturation pulse, and
   the three-dimensional data acquisition is not multi-slice data acquisition in which data acquisition is sequentially performed to multiple slices, but volume data acquisition in which data acquisition is performed to a single volume by applying encoding pulses in three axial directions.

6. The magnetic resonance imaging apparatus according to claim 5, wherein the control circuitry executes the pulse sequence in which T1 values or T2 values between tissues of a subject are weighted.

7. The magnetic resonance imaging apparatus according to claim 5, further comprising processing circuitry that reconstructs a T1-weighted image or a T2-weighted image based on data acquired by executing the pulse sequence.

* * * * *